(12) United States Patent
Sugiura

(10) Patent No.: US 9,806,635 B2
(45) Date of Patent: Oct. 31, 2017

(54) FLYBACK DIODE AND ON-BOARD POWER SOURCE DEVICE

(71) Applicant: Toyota Jidosha Kabushiki Kaisha, Toyota-shi Aichi-ken (JP)

(72) Inventor: Toshikazu Sugiura, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/239,437

(22) Filed: Aug. 17, 2016

(65) Prior Publication Data

US 2017/0062418 A1    Mar. 2, 2017

(30) Foreign Application Priority Data

Aug. 27, 2015  (JP) ................. 2015-168251

(51) Int. Cl.
| | |
|---|---|
| *H02P 1/00* | (2006.01) |
| *H02P 27/00* | (2006.01) |
| *H02M 7/537* | (2006.01) |
| *H02M 7/46* | (2006.01) |
| *H01L 25/07* | (2006.01) |
| *H01L 23/492* | (2006.01) |
| *H02P 27/06* | (2006.01) |
| *H02M 3/155* | (2006.01) |

(52) U.S. Cl.
CPC .......... *H02M 7/537* (2013.01); *H01L 23/492* (2013.01); *H01L 25/072* (2013.01); *H02M 7/46* (2013.01); *H01L 2224/33* (2013.01); *H02M 3/155* (2013.01); *H02P 27/06* (2013.01); *Y02B 70/1483* (2013.01)

(58) Field of Classification Search
CPC ...... H02M 7/003; H02M 7/5387; H02M 1/44; H02M 2003/1555; H02M 3/155; H02M 7/487; H02M 1/00; H02M 1/08; H02M 1/088; H02M 2001/327; H02M 5/458; H02M 7/06; H02M 7/537; H02M 7/538; H03K 17/74
USPC .......... 318/139, 400.3, 400.2; 257/140, 147; 363/132
See application file for complete search history.

(56) References Cited

U.S. PATENT DOCUMENTS

| | | | | |
|---|---|---|---|---|
| 5,661,644 | A * | 8/1997 | Bergman | .............. H02M 7/003 257/77 |
| 6,590,360 | B2 * | 7/2003 | Hirata | .................... B60K 6/485 318/151 |

(Continued)

FOREIGN PATENT DOCUMENTS

| | | |
|---|---|---|
| JP | 2002-164503 A | 6/2002 |
| JP | 2004289103 A | 10/2004 |

(Continued)

*Primary Examiner* — Paul Ip
(74) *Attorney, Agent, or Firm* — Dinsmore & Shohl LLP

(57) ABSTRACT

A SiC Schottky-barrier diode and a SiPiN diode are connected in parallel. Due to a difference in their thermal properties, a relatively large current flows in the SiPiN diode at a high temperature in which electro migration progresses easily in a solder layer, and the progression of the electro migration is suppressed. At a low temperature in which the electro migration does not progress so much, only a relatively small current flows in the SiPiN diode, and a loss suppression by the SiC Schottky-barrier diode is achieved.

9 Claims, 6 Drawing Sheets

(56) References Cited

U.S. PATENT DOCUMENTS

| | | | | |
|---|---|---|---|---|
| 6,979,863 B2* | 12/2005 | Ryu | ................... | H01L 29/872 257/335 |
| 7,462,886 B2* | 12/2008 | Sugawara | ............ | H01L 23/045 257/147 |
| 7,462,888 B2* | 12/2008 | Sugawara | ............ | H01L 23/045 257/147 |
| 7,482,237 B2* | 1/2009 | Sugawara | ............ | H01L 23/045 438/317 |
| 7,544,970 B2* | 6/2009 | Sugawara | ............ | H01L 23/045 257/147 |
| 7,777,257 B2* | 8/2010 | Khemka | ............ | H01L 29/0634 257/260 |
| 7,880,174 B2* | 2/2011 | Shimizu | ................. | H01L 25/18 257/449 |
| 8,441,075 B2* | 5/2013 | Ishikawa | ................ | H01L 27/06 257/197 |
| 8,599,585 B2* | 12/2013 | Yasuoka | ............... | H02M 7/487 363/132 |
| 8,619,448 B2* | 12/2013 | Ogawa | ................ | H02M 7/5387 363/132 |
| 8,860,170 B2* | 10/2014 | Ishikawa | ................ | H01L 25/18 257/474 |
| 8,901,699 B2* | 12/2014 | Ryu | ................... | H01L 29/872 257/472 |
| 9,070,571 B2* | 6/2015 | Lutz | .................... | H01L 27/0664 |
| 9,171,831 B2* | 10/2015 | Ishikawa | ................ | H01L 25/18 |
| 9,564,802 B2* | 2/2017 | Takao | ................... | H02M 3/155 |
| 9,595,958 B1* | 3/2017 | Nakano | ............. | H03K 17/6871 |
| 2001/0026141 A1* | 10/2001 | Hirata | ................... | B60K 6/485 318/727 |
| 2004/0212011 A1* | 10/2004 | Ryu | ................... | H01L 29/872 257/335 |
| 2004/0248330 A1 | 12/2004 | Kitabatake et al. | | |
| 2005/0285228 A1* | 12/2005 | Sugawara | ............ | H01L 23/045 257/584 |
| 2006/0186435 A1* | 8/2006 | Sugawara | ............ | H01L 23/045 257/170 |
| 2006/0208276 A1* | 9/2006 | Sugawara | ............ | H01L 23/045 257/147 |
| 2006/0255423 A1* | 11/2006 | Ryu | ................... | H01L 29/872 257/485 |
| 2008/0012042 A1* | 1/2008 | Sugawara | ............ | H01L 23/045 257/147 |
| 2008/0191305 A1* | 8/2008 | Khemka | ............ | H01L 29/0634 257/481 |
| 2008/0204115 A1* | 8/2008 | Sugawara | ............ | H01L 23/045 327/512 |
| 2008/0258252 A1* | 10/2008 | Shimizu | ................. | H01L 25/18 257/476 |
| 2009/0168471 A1* | 7/2009 | Tsugawa | ............ | H01L 29/8611 363/56.01 |
| 2009/0206781 A1* | 8/2009 | Itoh | ........................ | B60L 11/18 318/400.3 |
| 2009/0284198 A1* | 11/2009 | Shimana | ................. | B60L 3/003 318/400.21 |
| 2010/0066280 A1* | 3/2010 | Marchand | ................. | B60L 7/16 318/380 |
| 2010/0066400 A1* | 3/2010 | Hendrickson | ......... | B60L 3/0023 324/762.07 |
| 2010/0244092 A1* | 9/2010 | Ishikawa | ................ | H01L 27/06 257/140 |
| 2011/0241598 A1* | 10/2011 | Yamada | .................. | B60L 15/20 318/716 |
| 2011/0248286 A1 | 10/2011 | Onose | | |
| 2011/0248663 A1* | 10/2011 | Yamakawa | ............. | B60L 11/08 318/805 |
| 2011/0310643 A1* | 12/2011 | Yasuoka | ............... | H02M 7/487 363/37 |
| 2012/0007533 A1* | 1/2012 | Ogawa | ................ | H02M 7/5387 318/503 |
| 2012/0081045 A1* | 4/2012 | Takamatsu | ............. | B60L 3/003 318/400.3 |
| 2012/0249024 A1* | 10/2012 | Saha | ....................... | H02P 21/06 318/400.02 |
| 2013/0026955 A1* | 1/2013 | Kikunaga | ............. | H02P 27/085 318/51 |
| 2013/0187583 A1* | 7/2013 | Iwatsuki | ................... | H02P 6/10 318/400.17 |
| 2013/0214328 A1* | 8/2013 | Ishikawa | ................ | H01L 27/06 257/140 |
| 2013/0264975 A1* | 10/2013 | Kaita | ................... | B60L 11/1853 318/139 |
| 2014/0139150 A1* | 5/2014 | Morisaki | ................ | B60L 15/20 318/139 |
| 2014/0159622 A1* | 6/2014 | Morii | .................. | H02P 21/0085 318/400.3 |
| 2014/0176029 A1* | 6/2014 | Nomura | ................ | H02P 27/085 318/400.3 |
| 2014/0232304 A1* | 8/2014 | Sekiya | ....................... | H02P 3/18 318/400.02 |
| 2014/0264376 A1* | 9/2014 | Lutz | .................... | H01L 27/0664 257/77 |
| 2014/0286063 A1* | 9/2014 | Takao | ................... | H02M 7/06 363/89 |
| 2014/0320047 A1* | 10/2014 | Sakata | .................... | B60L 11/18 318/139 |
| 2014/0374794 A1* | 12/2014 | Ishikawa | ................ | H01L 27/06 257/139 |
| 2015/0085548 A1* | 3/2015 | Takao | ................... | H02M 3/155 363/131 |
| 2015/0311851 A1* | 10/2015 | Kondo | .................. | H02P 27/085 318/400.27 |
| 2015/0340965 A1* | 11/2015 | Hirao | ..................... | H03K 17/16 363/131 |

FOREIGN PATENT DOCUMENTS

| | | |
|---|---|---|
| JP | 2009159184 A | 7/2009 |
| JP | 2011222681 A | 11/2011 |
| JP | 2012248736 A | 12/2012 |
| JP | 2013118540 A | 6/2013 |
| JP | 5277579 B2 | 8/2013 |
| JP | 5663075 B2 | 2/2015 |
| JP | 2016-162902 A | 9/2016 |

* cited by examiner experiment example 1: 85A  N=6 experiment example 2: 120A  N=8

FLYBACK DIODE AND ON-BOARD POWER SOURCE DEVICE

CROSS-REFERENCE TO RELATED APPLICATION

This application claims priority to Japanese Patent Application No. 2015-168251 filed on Aug. 27, 2015, the entire contents of which are hereby incorporated by reference into the present application.

TECHNICAL FIELD

The present application relates to a flyback diode and an on-board power source device.

BACKGROUND ART

A technique that connects a switching element and a diode in parallel, and utilizes the diode in a flyback diode is known (e.g. Japanese Patent Application Publication No. 2002-164503). When a current flowing in a coil (e.g., reactor or motor) is turned on or off by the switching element, electromotive force is generated in the coil. A current generated by the electromotive force flows in the flyback diode. Other than a PiN diode that uses a Si substrate (referred in this description as SiPiND), a Schottky-barrier diode that uses a SiC substrate (referred in this description as SiCSBD) is known. When a SiCSBD is used in the flyback diode, a reverse recovery current can be suppressed and a loss can further be reduced than the SiPiND. Further, the SiCSBD has a higher resistance against breakage than the SiPiND, and can be used in a higher current density than the SiPiND.

A diode provided with a front surface electrode and a rear surface electrode, and that is used by connecting these electrodes to a conductor via solder layers is known. When a current flows in the solder layers, a phenomenon in which substances configuring the solder layers move and a quality of the solder layers deteriorates (this is called electro migration, referred in this description as EM) progresses. The EM has a faster progression rate with larger current densities, and has a faster progression rate with higher temperatures of the solder layers.

In a case of configuring a flyback diode by bonding solder layers to a front surface electrode and a rear surface electrode of the SiCSBD, EM tends to progress within the solder layers. As aforementioned, the SiCSBD can be used in a high current density. The current density that does not become problematic in the SiCSBD results in a current density by which EM progresses in the solder layers.

If a substrate area of the SiCSBD is made large, a difference in areas of solder layers for the front surface electrode and the rear surface electrode becomes large, and the current density can be reduced and a progression rate of the EM taking place in the solder layers can be reduced. However, a SiC substrate contains a large number of crystal defects, and if the substrate area is increased, yield for obtaining the SiCSBD decreases and manufacturing cost of the SiCSBD is increased. Accordingly, there is a demand for utilizing the SiCSBD, which can be manufactured with satisfactory yield and small substrate area, and used in a large current density.

SUMMARY

Disclosed herein is a technique that enables slowing a progression rate of EM taking place in solder layers without enlarging a substrate area of a SiCSBD.

Disclosed herein is a flyback diode in which a current caused by electromotive force generated when a current flowing in a coil is switched on or off flows. The flyback diode comprises: a Schottky-barrier diode comprising a SiC substrate (SiCSBD) and a PiN diode comprising a Si substrate (SiPiND) connected in parallel with the Schottky-barrier diode. An anode electrode and a cathode electrode cannot have a larger area than the SiC substrate, thus a solder layer likewise cannot have a larger area than the SiC substrate. A current density flowing through the SiC substrate and a current density flowing through the solder layer are substantially equal. A current density, which is not problematic to the SiC substrate may cause EM to progress in the solder layer.

In a flyback diode, a large current may flow in some cases, and a small current may flow in other cases. For example, in a case of a flyback diode used in an on-board power source device to be mounted on an electric vehicle, a hybrid vehicle, or a fuel cell vehicle, a large current flows therein in a case where the vehicle accelerates rapidly, and a small current flows therein in a case where the vehicle runs in its normal state. In the case where a large current flows in the flyback diode, the flyback diode generates heat and comes to have a high temperature, and the EM easily progresses in this state. In the case where a small current flows in the flyback diode, a heat generating amount of the flyback diode is small, and the EM is less likely to progress.

A relationship between a forward current flowing in a diode and a forward voltage changes according to temperature. Further, a temperature property thereof differs between the SiCSBD and the SiPiND. In a case of the SiCSBD, the forward current sensitively decreases accompanying a temperature rise despite the forward voltage being the same. In a case of the SiPiND, the forward current increases accompanying the temperature rise despite the forward voltage being the same. When the SiCSBD and the SiPiND are connected in parallel, a rate of (current flowing in SiCSBD/current flowing in SiPiND) decreases accompanying the temperature rise. A rate of a branched current branching to the SiPiND increases accompanying the temperature rise, and a rate of a current flowing in the SiCSBD decreases by the aforementioned increase. To the contrary, if the temperature drops, the rate of (current flowing in SiCSBD/current flowing in SiPiND) increases. The rate of the branched current branching to the SiPiND decreases accompanying the temperature drop, and the rate of the current flowing in the SiCSBD increases by the aforementioned decrease.

As a result, the following is obtained:

(i) During when the current flowing in the flyback diode is small, the heat generating amount of the flyback diode is small, and the flyback diode has a low temperature, the rate of the branched current branching to the SiPiND is low and most of the current flows in the SiCSBD. Even if most of the current flows in the SiCSBD, the EM does not progress in the solder layer bonded to the SiCSBD due to the flowing current being small and the temperature being low to begin with. Since most of the current flows in the SiCSBD, loss suppression is facilitated by the SiCSBD. As aforementioned, in the case of an on-board power source device, the aforementioned state takes place when a vehicle runs in a normal state. During the normal running state, the effect of loss suppression by the SiCSBD can be enjoyed. Consumption efficiency increases, and mileage until the next recharging or refueling can be increased.

(ii) During when the current flowing in the flyback diode is high, the heat generating amount of the flyback diode is large, and the flyback diode has a high temperature, the rate of the branched current branching to the SiPiND increases and a considerable amount of the current branches to the SiPiND. In this case, the rate of the branched current flowing in the SiCSBD decreases. In a high temperature state where the EM easily progresses in the solder layer bonded to the SiCSBD, the current flowing in the SiCSBD is suppressed, as a result of which the progression of the EM is inhibited. Due to the considerable amount thereof branching to the SiPiND, the effect of the loss suppression by the SiCSBD decreases. As aforementioned, in the case of the on-board power source device, the aforementioned state takes place in the case where the vehicle accelerates rapidly. The phenomenon of decreased loss suppression effect by the SiCSBD is a phenomenon that occurs under a temporal condition such as the rapid acceleration, and in the perspective of the driving as a whole, the phenomenon of decreased loss suppression effect by the SiCSBD is acceptable.

DETAILED DESCRIPTION

Figure 1:
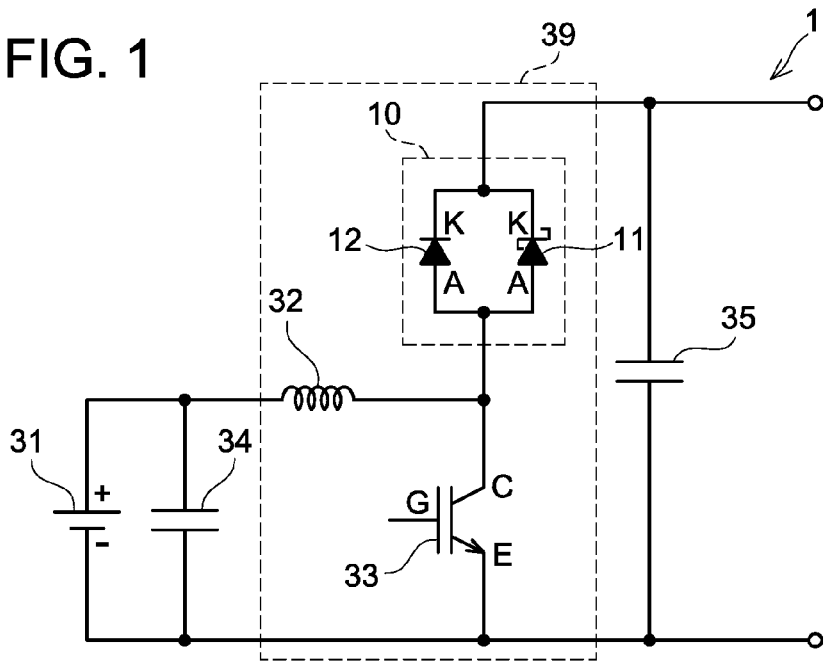
FIG. 1 is a circuit diagram of an on-board power source device of a first embodiment.

Features of a flyback diode disclosed herein will be described. A flyback diode that uses a SiCSBD and a SiPiND is advantageous in regards to its manufacturing cost. By making a SiCSBD substrate large, a current density in the SiCSBD can be suppressed without having have to use the SiPiND. A relationship of "(current that flows in solder layer of the SiCSBD while flyback diode has high temperature)/area of solder layer" <"current density by which EM progresses in solder layer" can be obtained. However, according to this scheme, manufacturing cost of the flyback diode increases. The technique disclosed herein can suppress the progression of the EM by a SiPiND that can be manufactured at low cost.

For example, assuming a maximum value of a large current that flows in the flyback diode when a vehicle accelerates rapidly or the like is A+B and the current density by which the EM progresses in the solder layer is F, then Unless the SiPiND is used, a SiCSBD having a substrate area equal to or greater than (A+B)/F is required.

In the present technique, the SiPiND is used in combination with the SiCSBD such that part of the A+B current flows through the SiPiND as well. For example, in embodiments, part of the current A+B that flows in the SiCSBD due to the rapid acceleration of the vehicle is A and part of the current A+B flows in the SiPiND is B. Accordingly, a substrate area for the SiCSBD equal to or more than A/F and a substrate area for the SiPiND equal to or more than B/F is needed. Also, the manufacturing cost for both a SiCSBD with a substrate area equal to A/F and a SiPiND with a substrate area equal to B/F is less than the manufacturing cost for a SiCSBD with a substrate area of A+B/F. Accordingly, manufacturing cost can be reduced by using the SiCSBD–SiPiND combination.

A decrease in the loss suppression effect by the SiCSBD may be of concern using the SiCSBD–SiPiND in combination, however, the flyback diode normally has a low temperature. Considering a case of when a most frequent current is flowing through the flyback diode, and assuming a current flowing in the SiCSBD during this case is equal to C and a current flowing in the SiPiND is equal to D, a relationship of (B/A)>(D/C) is obtained from the temperature properties of the SiCSBD and the SiPiND. Under the normal state, the current D becomes small so the decrease in the loss suppression effect by the SiCSBD can be accepted.

Upon designing a flyback diode, a current value for A+B is given, and a substrate area E of the SiCSBD (that is, an area of the solder layer) is designated. A relationship of A+B>E×F (F=a current density by which the EM progresses in the solder layer) is established. In this case, A is determined from a relationship of A=E×F, then B is determined, and the substrate area of the SiPiND may be determined from B. In the case of the SiPiND, in most cases there is no need to give consideration to the progression of the EM taking place in the solder layer, since its allowable current density is low.

The usefulness of the technique disclosed herein is not limited to a case where both an anode electrode and a cathode electrode are flat electrodes, and solder layers are bonded to both of them. In a case where the anode electrode is a flat electrode and a solder layer is bonded thereto, the progression of the EM in the solder layer bonded to the anode electrode can be suppressed without being restricted by the configuration on a cathode electrode side. In a case where the cathode electrode is a flat electrode and a solder layer is bonded thereto, the progression of the EM in the solder layer bonded to the cathode electrode can be suppressed without being restricted by the configuration on an anode electrode side. It is a technique useful for cases where at least one of the anode electrode and the cathode electrode is a flat electrode provided on a front surface of the SiC substrate, and a solder layer is bonded to that flat electrode.

The aforementioned flyback diode is especially useful in a case when the flyback diode is part of an on-board power source device. The on-board power source device in this case comprises a coil, a switching element, and the flyback diode, and each of a front surface electrode and a rear surface electrode of the flyback diode is connected to a conductor via a solder layer.

In a case of assuming that a current flowing in the SiCSBD when a largest allowable current is flowing in the flyback diode is equal to A, a current flowing in the SiPiND when the largest allowable current is flowing in the flyback diode is equal to B, a current flowing in the SiCSBD when the most frequent current is flowing in the flyback diode is equal to C, a current flowing in the SiPiND when the most frequent current is flowing in the flyback diode is equal to D, and a smallest area of the solder layer bonding to the SiCSBD is equal to E, the progression of the EM can be suppressed using a relationship "(A/E)<current density by which the electro migration progresses in solder layer", and the loss in the flyback diode upon its normal use can be suppressed using a relationship of "(B/A)>(D/C)".

Especially, it is preferable to use the flyback diode at an upper arm of a boost circuit where the EM occurs frequently. That is, a configuration is preferable in which an anode of the flyback diode is connected to a positive electrode of a battery via a coil, a cathode of the flyback diode is connected to a negative electrode of the battery via an inverter, and the inverter is connected to a traction motor.

First Embodiment

As shown in FIG. 1, an on-board power source device 1 of a first embodiment comprises a battery 31, a first capacitor 34, a converter 39, and a second capacitor 35. Power supplied from the battery 31 is output via the converter 39. The converter 39 boosts a voltage of the battery 31. The battery 31 is configured capable of recharging and discharging. This on-board power source device 1 is mounted for example on an electric vehicle, a hybrid vehicle, or a fuel cell vehicle and supplies power to a traction motor.

The converter 39 comprises a coil 32, a flyback diode 10 on an upper arm thereof, and a switching element 33 on a lower arm thereof. In the present embodiment, an IGBT (Insulated Gate Bipolar Transistor) is used as the switching element 33.

The flyback diode 10 comprises a Schottky-barrier diode (SiCSBD) 11 provided with a SiC substrate and a PiN diode (SiPiND) 12 provided with a Si substrate. The SiCSBD 11 and the SiPiND 12 are connected in parallel. The SiCSBD 11 has a metal making Schottky contact with an n-type SiC substrate. In the SiPiND 12, an n-type region and a p-type region are formed in the Si substrate. An area of an active region of the SiCSBD 11 is larger than an area of an active region of the SiPiND 12. A current density of a current that flows in the SiCSBD 11 is preferably equal to or less than 500 A/cm$^2$.

One end of the coil 32 is connected to a positive electrode of the battery 31. The other end of the coil 32 is connected to a collector electrode of the switching element 33 (IGBT). Further, the other end of the coil 32 is connected to an anode of the flyback diode 10. That is, the other end of the coil 32 is connected to an anode electrode of the SiCSBD 11 and an anode electrode of the SiPiND 12. An emitter electrode of the switching element 33 (IGBT) is connected to a negative electrode of the battery 31.

The switching element 33 is configured capable of switching between on and off. When the switching element 33 turns on, a current flowing in the coil 32 flows in the switching element 33. When the switching element 33 turns off, the current flowing in the coil 32 flows in the SiCSBD 11 and the SiPiND 12 of the flyback diode 10. A current that is caused by electromotive force, which is generated in the coil 32 when the switching element 33 is turned off, flows in the SiCSBD 11 and the SiPiND 12.

One end of the first capacitor 34 is connected to the positive electrode of the battery 31, and the other end thereof is connected to the negative electrode of the battery 31. The first capacitor 34 soothes a voltage supplied from the battery 31.

One end of the second capacitor 35 is connected to the cathode of the flyback diode 10, and the other end thereof is connected to the negative electrode of the battery 31. The second capacitor 35 soothes a voltage outputted from the converter 39.

Figure 2:
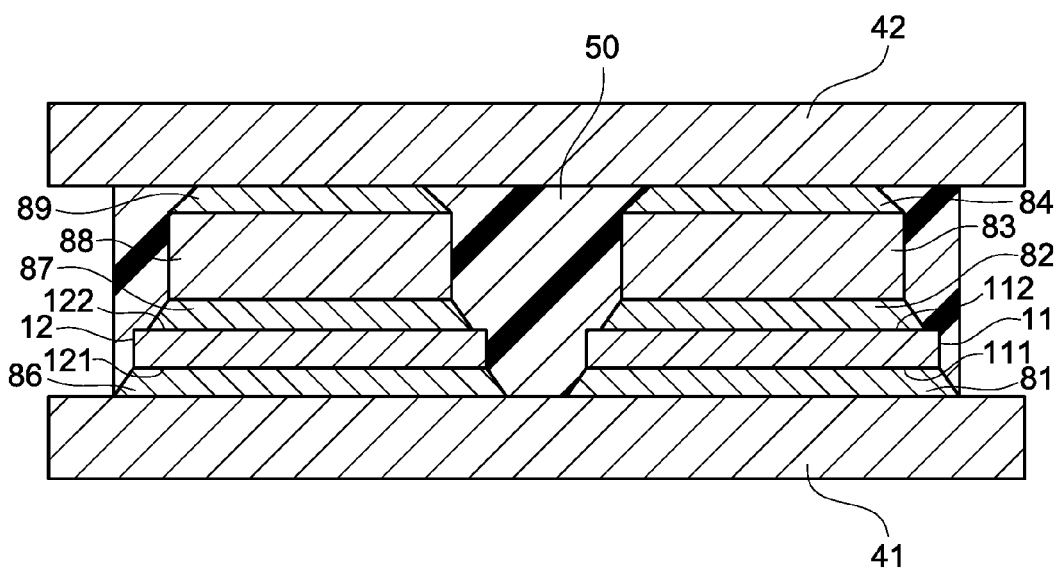
FIG. 2 is a cross sectional diagram showing a state in which a SiCSBD and a SiPiND are bound to conductors by solder layers.

As shown in FIG. 2, the SiCSBD 11 and the SiPiND 12 are arranged between a first conductor 41 and a second conductor 42. An anode electrode 111 of the SiCSBD 11 is electrically connected to the first conductor 41 via a solder layer 81. The SiCSBD 11 is bonded to the first conductor 41 via the solder layer 81. Further, a cathode electrode 112 of the SiCSBD 11 is electrically connected to the second conductor 42 via a solder layer 82, a metal block 83, and a solder layer 84. The SiCSBD 11 is bonded to the second conductor 42 via the solder layers 82, 84. The anode electrode 111 and the cathode electrode 112 are flat electrodes provided on surfaces (lower surface and upper surface) of the SiC substrate of the SiCSBD 111.

An anode electrode 121 of the SiPiND 12 is electrically connected to the first conductor 41 via a solder layer 86. The SiPiND 12 is bonded to the first conductor 41 via the solder layer 86. Further, a cathode electrode 122 of the SiPiND 12 is electrically connected to the second conductor 42 via a solder layer 87, a metal block 88, and a solder layer 89. The SiPiND 12 is bonded to the second conductor 42 via the solder layers 87, 89. The anode electrode 121 and the cathode electrode 122 are flat electrodes that are provided on surfaces (lower surface and upper surface) of the Si substrate of the SiPiND 12.

The SiCSBD 11 and the SiPiND 12 are sealed by sealing resin 50. A so-called 2-in-1 structure is formed, in which both the SiCSBD 11 and the SiPiND 12 are integrally sealed by the sealing resin 50. The sealing resin 50 fills vacant space between the first conductor 41 and the second conductor 42. The sealing resin 50 fills vacant space between the SiCSBD 11 and the SiPiND 12. The sealing resin 50 seals the SiCSBD 11, the SiPiND 12, the first conductor 41, the second conductor 42, and the solder layers 81, 82, 84, 86, 87, 89.

The first conductor 41 is electrically connected to the coil 32 shown in FIG. 1. The second conductor 42 is electrically connected to the second capacitor 35 shown in FIG. 1.

The metal block 83 is arranged between the SiCSBD 11 and the second conductor 42. The metal block 88 is arranged between the SiPiND 12 and the second conductor 42. The metal blocks 83, 88 are made for example of copper.

The solder layers (81, 82, 84, 86, 87, 89) are made of an alloy containing for example tin (Sn) as its main component. The solder defined for example in Japanese Technical Standard JIS Z 3282 may be used as the solder. Types of solder are not particularly limited. In the solder layers, EM occurs by a current flowing therein. The EM is a phenomenon in which defects are generated in solder layers by electrons moving through the solder layers. The EM occurs more frequently by a high-density current flowing in the solder layers. Further, the EM occurs more frequently when the solder layers have a high temperature. In the solder layers 81, 82, 84 bonding the SiCSBD 11 to the first conductor 41 and the second conductor 42, the EM occurs more frequently when the high-density current flows in the SiCSBD 11 and the SiCSBD 11 has a high temperature. Especially, the EM is most likely to occur in the solder layer 84 between the metal block 83 and the second conductor 42 due to its small area compared to solder layers 81 and 82.

Figure 3:
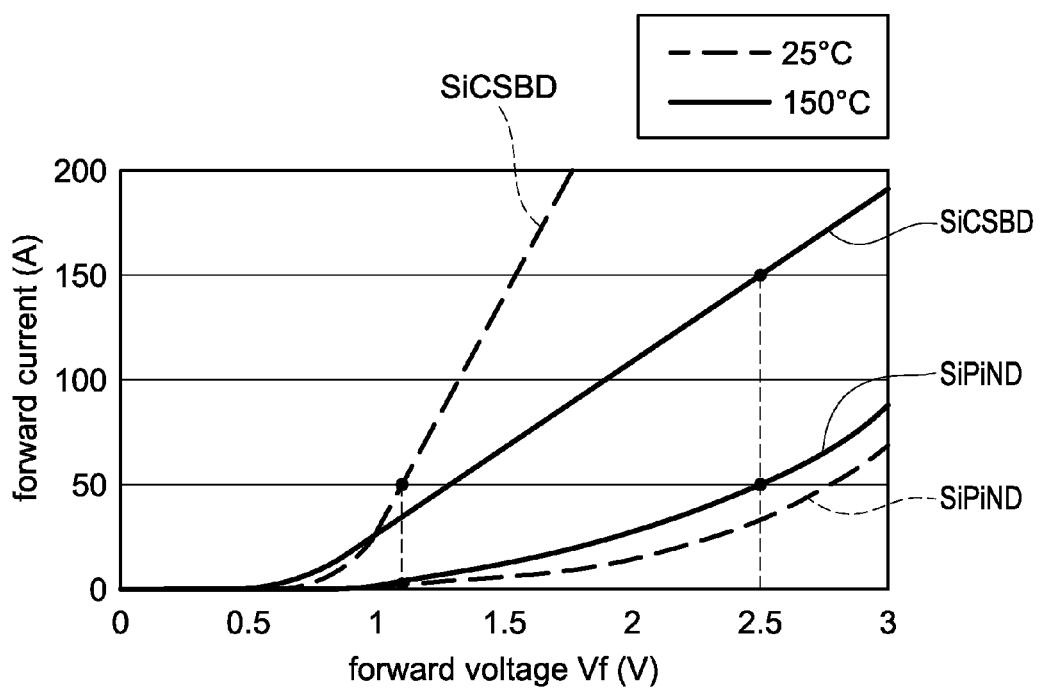
FIG. 3 is a graph showing that forward properties of the SiCSBD and the SiPiND change by temperature.

As shown in FIG. 3, a relationship of a forward current and a forward voltage of the SiCSBD 11 changes according to the temperature. Further, a relationship of a forward current and a forward voltage of the SiPiND 12 also changes according to the temperature. A temperature property of the SiCSBD 11 and a temperature property of the SiPiND 12 differ. The SiCSBD 11 has a positive temperature coefficient, whereas the SiPiND 12 has a negative temperature coefficient. In the SiCSBD 11, the forward current decreases accompanying the temperature increase even at the same forward voltage. In the SiPiND 12, the forward current increases accompanying the temperature increase even at the same forward voltage. Further, at any temperature, a rising voltage of the SiCSBD 11 is lower than a rising voltage of the SiPiND 12.

In the on-board power source device 1 having the above features, a current flows in the coil 32 and the switching element 33 when the switching element 33 is turned on. At this occasion, energy is stored in the coil 32. On the other hand, when the switching element 33 is turned off, a current flows in the coil 32 and the SiCSBD 11 and the SiPiND 12 of the flyback diode 10. Electromotive force is generated in the coil 32 when the switching element 33 is turned off (shifts from its on state to off state). The voltage rises due to the electromotive force generated in the coil 32 being added to the voltage of the battery 31. Due to this, the power of the battery 31 is boosted by the converter 39 and output.

In the aforementioned on-board power source device 1, a large current may flow in the SiCSBD 11 and the SiPiND 12 of the flyback diode 10, or a small current may flow therein. For example, when the vehicle accelerates rapidly a large current flows in the SiCSBD 11 and the SiPiND 12, and a small current flows therein when the vehicle runs in its normal state. When the large current flows in the SiCSBD 11 and the SiPiND 12, the SiCSBD 11 and the SiPiND 12 generate heat and may have a high temperature. On the other hand, when the small current flows in the SiCSBD 11 and the SiPiND 12, the heat generation of the SiCSBD 11 and the SiPiND 12 is suppressed and the SiCSBD 11 and the SiPiND 12 may have a low temperature.

A case will be assumed in which the SiCSBD 11 and the SiPiND 12 have a high temperature (for example, 150° C.). In this case, as shown in FIG. 3, when a large current (150 A) flowing in the SiCSBD 11 and the a current (50 A) flowing in the SiPiND 12 by a forward voltage (2.5V) corresponding thereto are compared, a ratio of the current (150 A) in the SiCSBD 11 and the current (50 A) in the SiPiND 12 is 3:1.

Contrary to this, a case will be assumed in which the SiCSBD 11 and the SiPiND 12 have a low temperature (for example, 25° C.). In this case, as shown in FIG. 3, when a small current (50 A) flowing in the SiCSBD 11 and a small current (5 A) flowing in the SiPiND 12 by a forward voltage (1.1 V) corresponding thereto are compared, a ratio of the current (50 A) in the SiCSBD 11 and the current (5 A) in the SiPiND 12 is 10:1.

In comparing the respective cases above, the ratio of the current of the SiCSBD 11 and the current of the SiPiND 12 is 3:1 in the case of a large current and high temperature, and the ratio of the current of the SiCSBD 11 and the current of the SiPiND 12 is 10:1 in the case of a small current and low temperature. That is, in the case where a large current flows in the SiCSBD 11 and the SiPiND 12 and the SiCSBD 11 and the SiPiND 12 have a high temperature, a relatively large current can flow through the SiPiND 12 by using the difference in the forward properties of the SiCSBD 11 and the SiPiND 12. In the case where a small current flows in the SiCSBD 11 and the SiPiND 12 and the SiCSBD 11 and the SiPiND 12 have a low temperature, only a relatively small current can flow through the SiPiND 12, and the majority of the current can flow in the SiCSBD 11.

As above, a large current can be dispersed in the SiCSBD 11 and the SiPiND 12 in the case with a large current and high temperature. Accordingly, the current density flowing in the solder layers 81, 82, 84 bonded to the SiCSBD 11 can be suppressed from increasing. Further, the accumulation of the current in the SiCSBD 11 which brings the SiCSBD 11 to even a higher temperature can also be suppressed. Due to this, the progression of the EM in the solder layers electrically connected to the SiCSBD 11 can be suppressed. Due to this, for example, the progression of the EM can be suppressed even when the vehicle accelerates rapidly.

On the other hand, in the case with a small current and low temperature, current does not flow through the SiCSBD 11 and the SiPiND 12 but instead the current flows accumulatively in the SiCSBD 11. Due to this, for example, the SiCSBD 11 can be utilized actively when the vehicle runs in its normal state.

Although the above embodiment has been described in detail, the specific configuration is not limited to the above embodiment. In the description hereinbelow, the configuration that is similar to the configuration as the above description will be given the same reference signs and the description thereof may be omitted.

Second Embodiment

Figure 4:
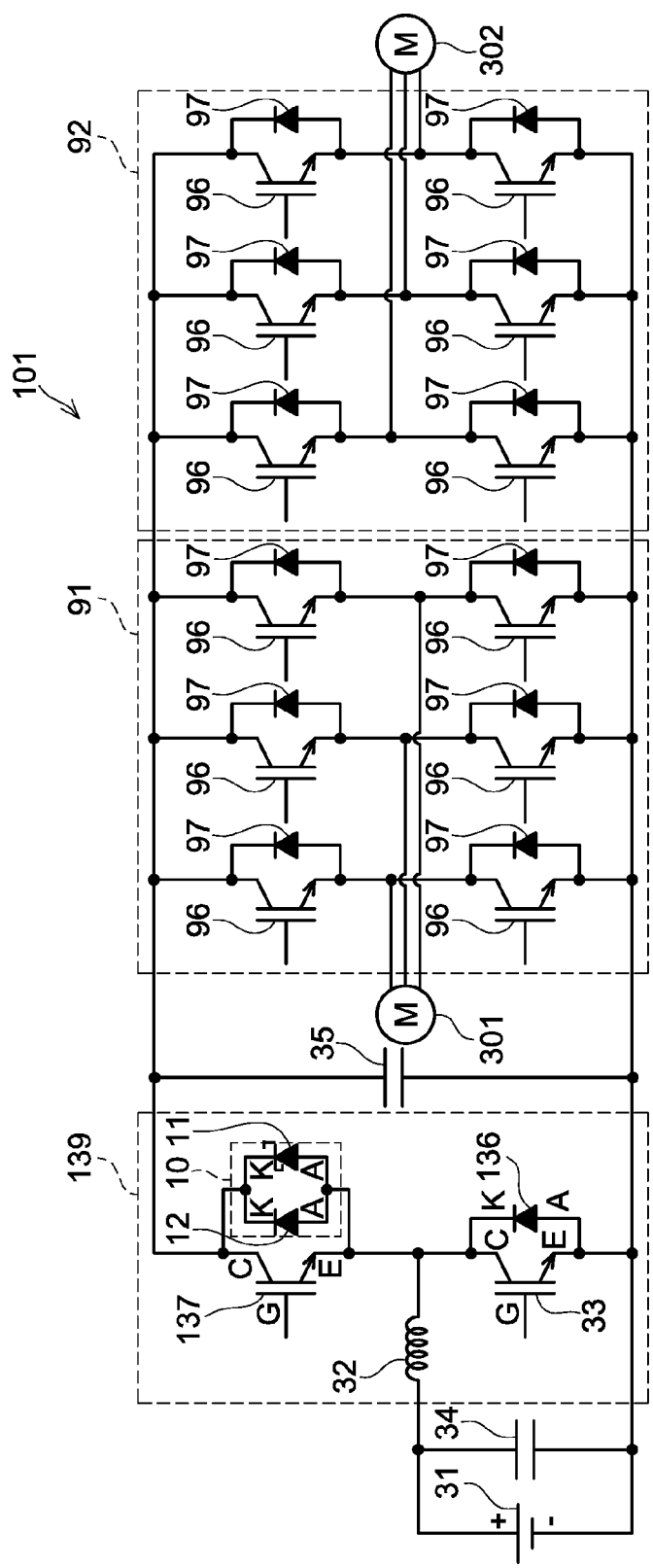
FIG. 4 is a circuit diagram of an on-board power source device of a second embodiment.
Figure 5A:
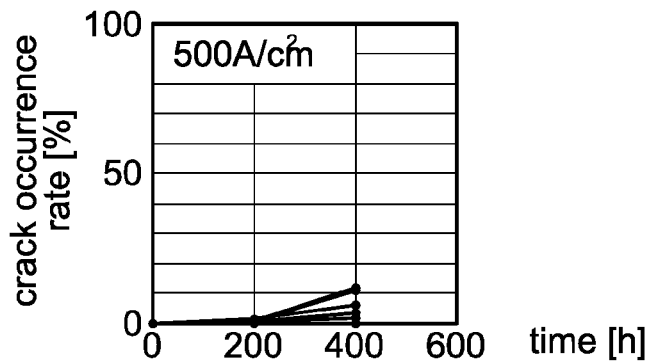
FIG. 5A is a graph showing a relationship of time of current flowing through an SiCSBD and an occurrence rate of cracks in a solder layer.
Figure 5B:
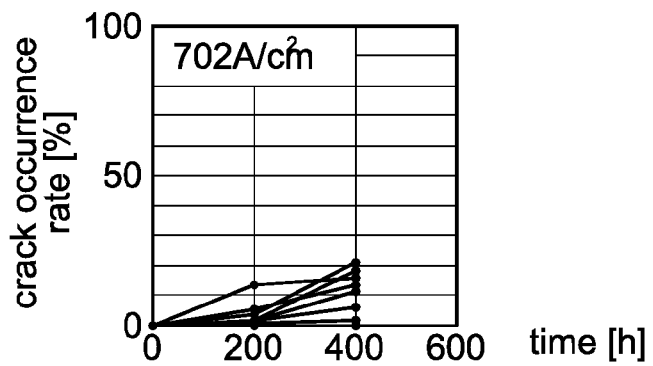
FIG. 5B is a graph showing a relationship of time of current flowing through an SiCSBD and an occurrence rate of cracks in a solder layer.
Figure 5C:
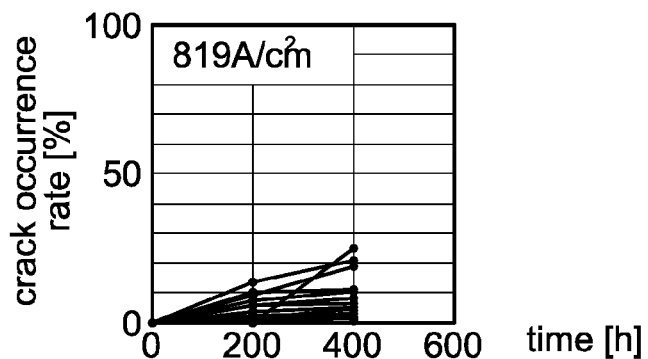
FIG. 5C is a graph showing a relationship of time of current flowing through an SiCSBD and an occurrence rate of cracks in a solder layer.
Figure 5D:
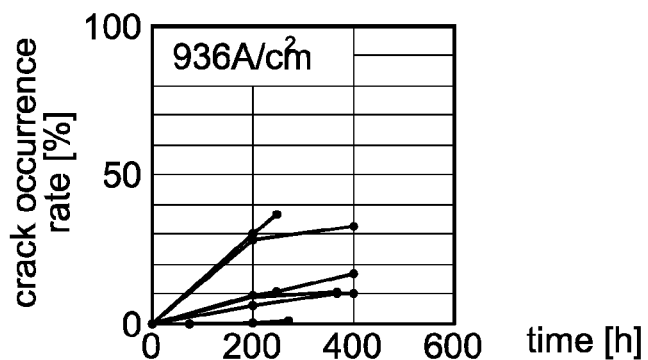
FIG. 5D is a graph showing a relationship of time of current flowing through an SiCSBD and an occurrence rate of cracks in a solder layer.

As shown in FIG. 4, an on-board power source device 101 of a second embodiment comprises a battery 31, a first capacitor 34, a converter 139, a second capacitor 35, a first inverter 91, and a second inverter 92. Power supplied from the battery 31 is input to the first inverter 91 and the second inverter 92 via the converter 139. The converter 139 boosts the battery 31.

The converter 139 comprises a coil 32, a first switching element 33, a flyback diode 136, a second switching element 137, and a flyback diode 10. In the present embodiment, a PiN diode provided with a Si substrate is used as the lower-arm flyback diode 136. Further, in the present embodiment, an IGBT is used as the upper-arm second switching element 137. Notably, the first switching element 33 has the same configuration as the switching element 33 of the above first embodiment.

The first switching element 33 and the flyback diode 136 are connected in anti-parallel. A cathode electrode of the flyback diode 136 is connected to the other end of the coil 32. An anode electrode of the flyback diode 136 is connected to a negative electrode of the battery 31.

The second switching element 137 and the flyback diode 10 are connected in anti-parallel. An emitter electrode of the second switching element 137 is connected to the other end of the coil 32. A collector electrode of the second switching element 137 is connected to one end of the first inverter 91 and one end of the second inverter 92.

The other end of the first inverter 91 and the other end of the second inverter 92 are connected to a negative electrode of the battery 31. A cathode of the flyback diode 10 is connected to the negative electrode of the battery 31 via the first inverter 91 and the second inverter 92. Further, an anode of the flyback diode 10 is connected to the positive electrode of the battery 31 via the coil 32.

The first inverter 91 is connected to a first traction motor 301. The second inverter 92 is connected to a second traction motor 302. The first inverter 91 and the second inverter 92 convert a direct current outputted from the converter 139 into a three-phase alternating current. Power of the converted three-phase alternating current is supplied to the first motor 301 and the second motor 302.

Each of the first inverter 91 and the second inverter 92 comprises a plurality of switching elements 96 and a plurality of diodes 97. Each of the switching elements 96 and its corresponding one of the diodes 97 are connected antiparallel.

In the on-board power source device 101 having the above features, a current flows in the coil 32 and the first switching element 33 when the first switching element 33 is turned on. At this occasion, energy is stored in the coil 32. On the other hand, when the first switching element 33 is turned off, a current flows in the coil 32 and a SiCSBD 11 and a SiPiND 12 of the flyback diode 10. Electromotive force is generated in the coil 32 when the first switching element 33 is turned off (shifts from its on state to off state). The voltage rises due to the electromotive force being added to the voltage of the battery 31. Due to this, the power of the battery 31 is boosted by the converter 139 and outputted.

The power outputted from the converter 139 is converted into a three-phase alternating current respectively by the first inverter 91 and the second inverter 92. The power converted respectively by the first inverter 91 and the second inverter 92 is supplied to each of the first motor 301 and the second motor 302.

On the other hand, upon regeneration, the first motor 301 and the second motor 302 serve as generators and a current flows into the converter 139 from each of them respectively via the first inverter 91 and the second inverter 92. In this case, the second switching element 137 performs switching, and the battery 31 is charged by supplying bucked voltage to the battery 31. The converter 139 is a bidirectional DC/DC converter capable of bucking and boosting.

Similar to the first embodiment, the on-board power source device 101 of the second embodiment can disperse the current to the SiCSBD 11 and the SiPiND 12 in the case with the large current and high temperature. Accordingly, the accumulation of the current in the SiCSBD 11 which brings the SiCSBD 11 to a higher temperature can be suppressed. Due to this, the progression of the EM in solder layers 81, 82, 84 electrically connected to the SiCSBD 11 can be suppressed. On the other hand, in the case with the small current and low temperature, the current can flow accumulatively in the SiCSBD 11 instead of dispersing the current in the SiCSBD 11 and the SiPiND 12.

EXAMPLE

Next, one method of determining an area of the SiCSBD 11 and an area of the SiPiND 12 will be described. Firstly, a maximum rated current density by which the solder layers in the SiCSBD 11 can be used without a problem will be assumed as F (Amp/cm$^2$=A/cm$^2$). The maximum rated current density F can be obtained experimentally. For example, the maximum rated current density can be determined by considering a detaching rate of the solder layer 84, in which the EM is most likely to occur when a current flows in the SiCSBD 11. Further, the area of the SiCSBD 11 (area of an active region of the SiCSBD 11) will be assumed as E (cm$^2$). In this case, a maximum current A (A) that flows in the SiCSBD 11 becomes A=F×E (A). Further, the forward voltage when the current A (A) flows in the SiCSBD 11 will be assumed as Vf1 (V).

On the other hand, a maximum rated current of the flyback diode 10 will be assumed as A+B (A). In this case, a current desired to flow in the SiPiND 12 of the flyback diode 10 can be expressed as B (A).

Further, in a case where the forward voltage when the current B(A) flows in the SiPiND 12 is Vf1 (V), the area G(cm$^2$) of the SiPiND 12 at that occasion is determined as the area of the SiPiND 12. As above, the area E(cm$^2$) of the SiCSBD 11 and the area G(cm$^2$) of the SiPiND 12 can be determined.

Experiment Examples

A rate by which cracks occur in a solder layer by EM occuring in the solder layer by a current flowing in the SiCSBD was measured. In the experiment examples, a plurality of samples were used to measure the rate by which the cracks occurred in the solder layers (81, 82, 84) when current flowed through the SiCSBD 11 shown in FIG. 2. In the experiment examples, the area of the active region of the SiCSBD 11 was set to 0.171 cm$^2$. Maximum magnitudes of the current flowing in the SiCSBD 11 were given four patterns, namely 85 A, 120 A, 140 A, and 160 A. Further, the current flowed through the SiCSBD 11 for over 400 hours. The temperature of the SiCSBD 11 was 150° C.

Experiment Example 1

In an experiment example 1, the magnitude of the current flowing through the SiCSBD 11 was set to 85 A. That is, a current density of the current flowing through the SiCSBD 11 was set to 500 A/cm$^2$ (85 A/0.171 cm$^2$). The number of samples (N) tested was six.

Experiment Example 2

In an experiment example 2, the magnitude of the current flowing through the SiCSBD 11 was set to 120 A. That is, a current density of the current flowing through the SiCSBD 11 was set to 702 A/cm$^2$ (120 A/0.171 cm$^2$). The number of samples (N) tested was eight.

Experiment Example 3

In an experiment example 3, the magnitude of the current flowing through the SiCSBD 11 was set to 140 A. That is, a current density of the current flowing through the SiCSBD 11 was set to 819 A/cm$^2$ (140 A/0.171 cm$^2$). The number of samples (N) tested was twelve.

Experiment Example 4

In an experiment example 4, the magnitude of the current flowing through the SiCSBD 11 was set to 160 A. That is, a current density of the current flowing through the SiCSBD 11 was set to 936 A/cm$^2$ (160 A/0.171 cm$^2$). The number of samples (N) tested was eight.

(Results)

As shown in FIGS. 5A to 5D, the crack occurrence rate for test times up to 200 hours was low in the experiment example 1. Compared to this, the crack occurrence rate was higher in the experiment examples 2, 3, and 4. Based on the testing results, it has been found that the crack occurrence rate in the solder layers can be kept low even if the current flows in the SiCSBD 11 for over 200 hours and the current density of the current flowing in the SiCSBD 11 is equal to or less than 500 A/cm$^2$.

(Example of Areas of SiCSBD and SiPiND)

As above, it has been found that it is preferable to set the current density of the current that flows in the SiCSBD to be equal to or less than 500 A/cm$^2$ so as to suppress the crack occurrence rate in the solder layers low.

On the other hand, if the area of the SiCSBD becomes large, a non-defective rate upon manufacturing a plurality of SiCSBDs decreases. Thus, it is preferable to limit the area of the SiCSBD to within a predetermined size to achieve a predetermined non-defective rate. For example, by considering the non-defective rate, the area of the active region of the SiCSBD may be set to 0.25 cm$^2$. In this case, the maximum current that flows in the SiCSBD becomes 125 A (500 A/cm$^2 \times$0.25 cm$^2$).

Figure 6:
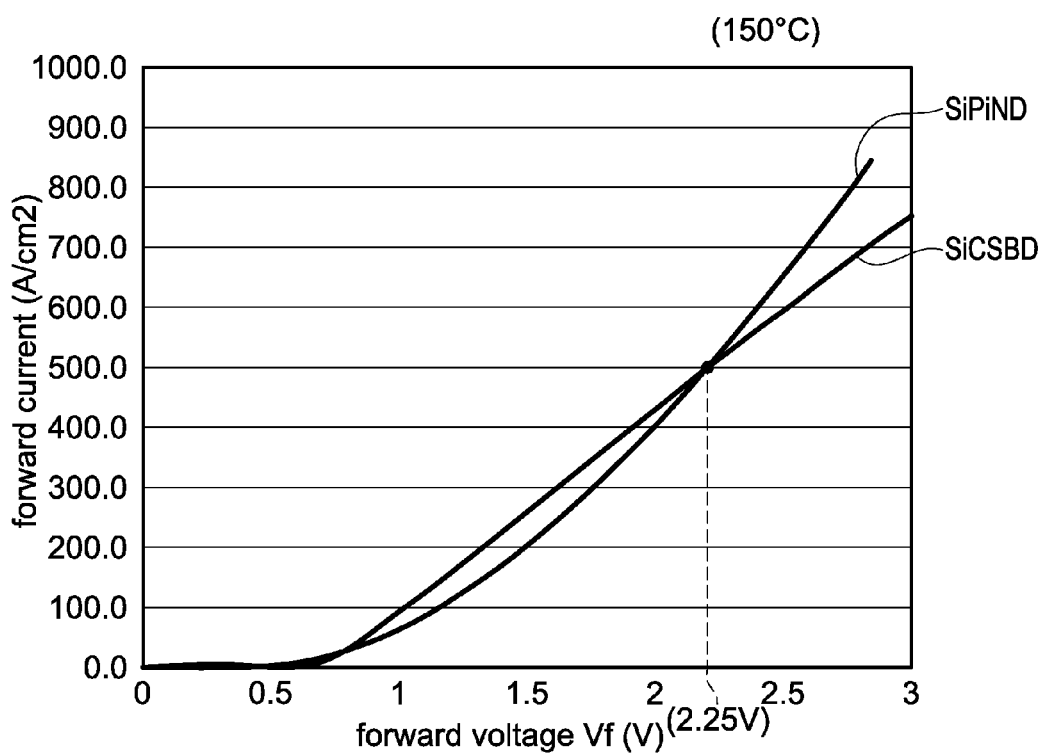
FIG. 6 is a graph showing a relationship of forward voltages and current densities of the SiCSBD and the SiPiND.

Further, as shown in FIG. 6, when the temperature of the SiCSBD is 150° C. and the current density of the current flowing in the SiCSBD is 500 A/cm$^2$, it is known that the forward voltage of the SiCSBD is 2.25 V.

In the configuration shown in FIGS. 1 and 2, the maximum current that flows in the flyback diode 10 is set for example to 200 A. In this case, and assuming that the maximum current that flows in the SiCSBD 11 is 125 A as in the above case, the maximum current that flows in the SiPiND 12 becomes 85 A (200 A-125 A).

Further, as shown in FIG. 6, when the temperature of the SiPiND is 150° C. and the forward voltage of the SiPiND is 2.25 V, it is known that the current density of the current flowing in the SiPiND is 500 A/cm$^2$.

In assuming as such, the area of the SiPiND needs to be set to 0.17 cm$^2$ (85 A/500 A/cm$^2$) in order to achieve the size for 85 A of current to flow in the SiPiND when the forward voltage of the SiPiND is 2.25V (the current density of the current flowing in the SiPiND is 500 A/cm$^2$).

As above, in the configuration shown in FIGS. 1 and 2, the area of the active region of the SiCSBD 11 is set to 0.25 cm$^2$, and the area of the active region of the SiPiND 12 is set to 0.17 cm$^2$. In so doing, in the case where the current that flows in the flyback diode 10 is 200 A, the maximum current that flows in the SiCSBD 11 is 125 A, and the maximum current that flows in the SiPiND 12 is 85 A. The ratio of the current (125 A) of the SiCSBD 11 and the current (85 A) of the SiPiND 12 is 25:17 (125:85).

Further, in this case, the temperature of the SiCSBD 11 and the SiPiND 12 is 150° C., and the forward voltage of the SiCSBD 11 and the SiPiND 12 is 2.25V. The current density of the SiCSBD 11 is 500 A/cm$^2$, and the current density of the SiPiND 12 is also 500 A/cm$^2$. The current density of the current that flows in the SiCSBD is 500 A/cm$^2$ at its maximum, so the crack occurrence rate in the solder layers (81, 82, 84) can be suppressed and kept low.

Notably, in the above configuration, in a case where the current that flows in the flyback diode 10 is 40 A, the maximum current that flows in the SiCSBD 11 is 35 A, and the maximum current that flows in the SiPiND 12 is 5 A. The ratio of the current (35 A) of the SiCSBD 11 and the current (5 A) of the SiPiND 12 is 7:1 (35:5). Further, in this case, the temperature of the SiCSBD 11 and the SiPiND 12 is 25° C., and the forward voltage of the SiCSBD 11 and the SiPiND 12 is 1V.

As above, according to the above configuration, the current can be dispersed in the SiCSBD 11 and the SiPiND 12 in the case with large current and high temperature. In the case with the small current and low temperature, the current can flow accumulatively in the SiCSBD 11 without dispersing it in the SiCSBD 11 and the SiPiND 12.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations. The combinations thereof are not limited to those described in the claims as originally filed.

The on-board power source device that uses the flyback diode is disclosed herein. The anode of the flyback diode may be connected to the positive electrode of the battery via the coil. The cathode of the flyback diode may be connected to the negative electrode of the battery via the inverter. The inverter may be connected to the traction motor.

In the case where the on-board power source device is mounted on a hybrid vehicle or an electric vehicle, the relatively large current can be dispersed in the SiPiND when the vehicle accelerates rapidly. On the other hand, when the vehicle runs in the normal state, only a relatively small current is dispersed in the SiPiND, and the current can be flown accumulatively and primarily in the SiCSBD.

In embodiments, the flyback diode operates primarily at a fuel consumption point. The fuel consumption point refers to a range of 10 to 20% of the maximum output of the on-board power source device, and is a range by which the temperature rise in the SiCSBD and the SiPiND of the flyback diode is within 0 to 10° C. The temperature of the SiCSBD and the SiPiND of the flyback diode operating at the fuel consumption point is less than 60° C. The flyback diode operates primarily at the fuel consumption point during when the vehicle runs in its normal state.

In embodiments, a current density of a current that flows in the Schottky-barrier diode may be equal to or less than 500 A/cm$^2$.

According to this configuration, the occurrence of cracks in the solder layers caused by the EM can be suppressed.

In embodiments, the Schottky-barrier diode and the PiN diode may be sealed by sealing resin.

What is claimed is:

1. A flyback diode in which a current caused by electromotive force generated when a current flowing in a coil is switched on or off flows, the flyback diode comprising:
    a Schottky-barrier diode comprising a SiC substrate; and
    a PiN diode comprising a Si substrate and connected in parallel with the Schottky-barrier diode,
    wherein
    at least one of an anode electrode and a cathode electrode of the Schottky-barrier diode is a flat electrode provided on a surface of the SiC substrate, and
    a solder layer is bonded to the flat electrode.

2. The flyback diode according to claim 1, wherein
    a current density of a current that flows in the Schottky-barrier diode is equal to or less than 500 A/cm$^2$.

3. The flyback diode according to claim 1, wherein
    the Schottky-barrier diode and the PiN diode are sealed by sealing resin.

4. An on-board power source device comprising:
    the flyback diode according to claim 1,
    wherein
    an anode of the flyback diode is connected to a positive electrode of a battery through the coil,
    a cathode of the flyback diode is connected to a negative electrode of the battery through an inverter, and
    the inverter is connected to a traction motor.

5. A flyback diode in which a current caused by electromotive force generated when a current flowing in a coil is switched on or off flows, the flyback diode comprising:
- a Schottky-barrier diode comprising a SiC substrate; and
- a PiN diode comprising a Si substrate and connected in parallel with the Schottky-barrier diode, wherein at least one of an anode electrode and a cathode electrode of the Schottky-barrier diode is a flat electrode provided on a surface of the SiC substrate, a solder layer is bonded to the flat electrode, an area of the flat electrode is not larger than an area of the SiC substrate, and an area of the solder layer is not larger than the area of the SiC substrate.

6. The flyback diode according to claim 5, wherein a current density of a current that flows in the Schottky-barrier diode is equal to or less than 500 A/cm².

7. The flyback diode according to claim 5, wherein the Schottky-barrier diode and the PiN diode are sealed by sealing resin.

8. The flyback diode according to claim 5, wherein a current density flowing through the SiC substrate and a current density flowing through the solder layer are substantially equal.

9. An on-board power source device comprising:

the flyback diode according to claim 5, wherein an anode of the flyback diode is connected to a positive electrode of a battery through the coil, a cathode of the flyback diode is connected to a negative electrode of the battery through an inverter, and the inverter is connected to a traction motor.

\* \* \* \* \*